US012745487B2

(12) United States Patent
Lim et al.

(10) Patent No.: US 12,745,487 B2
(45) Date of Patent: Sep. 22, 2026

(54) OPTICAL DETECTION DEVICE INCLUDING CASE HAVING RUGGED STRUCTURE

(71) Applicant: PixArt Imaging Inc., Hsin-Chu City (TW)

(72) Inventors: Wan Piang Lim, Penang (MY); Sai Mun Lee, Penang (MY)

(73) Assignee: PixArt Imaging Inc., Hsin-Chu City (TW)

( * ) Notice: Subject to any disclaimer, the term of this patent is extended or adjusted under 35 U.S.C. 154(b) by 446 days.

(21) Appl. No.: 18/368,034

(22) Filed: Sep. 14, 2023

(65) Prior Publication Data

US 2025/0098364 A1 Mar. 20, 2025

(51) Int. Cl.
*H10F 77/00* (2025.01)
*H10F 77/20* (2025.01)
*H10F 77/40* (2025.01)

(52) U.S. Cl.
CPC ............. *H10F 77/93* (2025.01); *H10F 77/20* (2025.01); *H10F 77/413* (2025.01)

(58) Field of Classification Search
CPC ........ H10F 77/93; H10F 77/20; H10F 77/413; H10F 77/407; H10F 77/50; H10F 3/04; G02B 7/02
See application file for complete search history.

(56) References Cited

U.S. PATENT DOCUMENTS

| | | | | |
|---|---|---|---|---|
| 7,821,564 | B2 * | 10/2010 | Avron | G02B 7/022 348/340 |
| 11,082,640 | B2 * | 8/2021 | Nagata | G01J 5/046 |
| 11,194,230 | B2 * | 12/2021 | Rafalowski | G02B 7/008 |
| 2007/0085103 | A1 * | 4/2007 | Nishioka | H10H 20/8515 257/E33.072 |
| 2011/0075021 | A1 * | 3/2011 | Chang | G02B 7/022 348/374 |
| 2017/0179365 | A1 * | 6/2017 | Yonemura | B06B 1/0622 |
| 2018/0095204 | A1 * | 4/2018 | Lin | G02B 5/003 |
| 2018/0176431 | A1 * | 6/2018 | Kim | G02B 27/0006 |
| 2020/0177774 | A1 * | 6/2020 | Tanoue | H04N 23/54 |
| 2020/0403017 | A1 * | 12/2020 | Wang | H10F 77/50 |
| 2022/0005790 | A1 * | 1/2022 | Watanabe | H01L 25/167 |

FOREIGN PATENT DOCUMENTS

| | | | | |
|---|---|---|---|---|
| JP | 2007233262 A | * | 9/2007 | G02B 7/02 |
| JP | 2011200949 A | * | 10/2011 | B24B 13/005 |

* cited by examiner

*Primary Examiner* — Ida M Soward
(74) *Attorney, Agent, or Firm* — Winston Hsu

(57) ABSTRACT

An optical detection device with enhanced electrostatic discharge immunity includes a circuit board, a lens component and a case. The circuit board has a plurality of electrodes. The lens component is disposed on the circuit board. The case includes an accommodating chamber and an opening structure. The accommodating chamber is adapted to accommodate the circuit board and the lens component. The opening structure is communicated with the accommodating chamber. The case further includes a rugged structure disposed around the opening structure and adapted to engage with the lens component for extending an electrostatic discharge path from the opening structure to a nearest electrode of the plurality of electrodes.

15 Claims, 10 Drawing Sheets

OPTICAL DETECTION DEVICE INCLUDING CASE HAVING RUGGED STRUCTURE

BACKGROUND OF THE INVENTION

1. Field of the Invention

The present invention relates to an optical detection device, and more particularly, to an optical detection device with enhanced electrostatic discharge immunity.

2. Description of the Prior Art

Please refer to FIG. 10. FIG. 10 is a sectional view of an optical detection device 100 in the prior art. The optical detection device 100 includes a circuit board 102 with electrodes 104, a lens component 106 and a case 108. The circuit board 102 and the lens component 106 are disposed inside the case 108. The lens component 106 receives optical signals through a hole 110 formed on the case 108. The case 108 has a supporting surface 112 and a blocking wall 114 respectively abutting against a bottom surface and a lateral surface of the lens component 106. An electrostatic discharge path of the optical detection device 100 is set from the hole 110, through a gap between the lens component 106 and the supporting surface 112 and the blocking wall 114 and further through an air gap, to arrive the electrode 104. In the past operation, the conventional electrostatic discharge path of the optical detection device 100 is short, and is difficult to control electrostatic being discharged to a specific electrode with electrostatic protection design. Therefore, design of an optical detection device that has advantages of the same outward appearance, the lengthened discharge path and the simplified inner components is an important issue in the related optical design industry.

SUMMARY OF THE INVENTION

The present invention provides an optical detection device with enhanced electrostatic discharge immunity for solving above drawbacks.

According to the claimed invention, an optical detection device with enhanced electrostatic discharge immunity includes a circuit board, a lens component and a case. The circuit board has a plurality of electrodes. The lens component is disposed on the circuit board. The case includes an accommodating chamber and an opening structure. The accommodating chamber is adapted to accommodate the circuit board and the lens component. The opening structure is communicated with the accommodating chamber. The case further includes a rugged structure disposed around the opening structure and adapted to engage with the lens component for extending an electrostatic discharge path from the opening structure to a nearest electrode of the plurality of electrodes.

According to the claimed invention, a plurality of distances between each section of an outer edge of the opening structure and each corresponding section of the rugged structure has the same value, or a difference between any two of the plurality of distances is smaller than a predefined threshold. A plurality of intervals between a central axis of the opening structure and each section of an outer edge of the opening structure has the same value, or a difference between any two of the plurality of intervals is smaller than a predefined threshold.

According to the claimed invention, the case further includes a block disposed on position adjacent to a side of the lens component opposite to the opening structure, and the rugged structure and the block are adapted to fix the lens component. The case further includes an abutting surface connected with a lateral wall of the opening structure and adapted to abut against the lens component, and the rugged structure is protruded from the abutting surface and located between the lens component and the opening structure.

According to the claimed invention, the lens component includes a lens body, a first supporting portion and a second supporting portion, the first supporting portion and the second supporting portion are respectively stretched from two opposite sides of the lens body to connect the circuit board and the case, and the rugged structure contacts an inner lateral surface of the second supporting portion adjacent to the lens body. A structural width of the second supporting portion is the same as or smaller than a structural width of the first supporting portion.

According to the claimed invention, the case further includes an abutting surface connected with a lateral wall of the opening structure and adapted to abut against the lens component, and the rugged structure is concavely formed on position of the abutting surface facing the lens component. The lens component includes a lens body, a first supporting portion and a second supporting portion, the first supporting portion and the second supporting portion are respectively stretched from two opposite sides of the lens body to connect the circuit board and the case, and the second supporting portion comprises a protruding portion inserted into the rugged structure. The protruding portion is disposed on an outer lateral surface of the second supporting portion opposite to the lens body, or an inner lateral surface of the second supporting portion adjacent to the lens body, or a middle part between the inner lateral surface and the outer lateral surface.

According to the claimed invention, the case further includes an abutting surface connected with a lateral wall of the opening structure and adapted to abut against the lens component, and the rugged structure is protruded from position of the abutting surface aligning with the lens component. The lens component includes a lens body, a first supporting portion and a second supporting portion, the first supporting portion and the second supporting portion are respectively stretched from two opposite sides of the lens body to connect the circuit board and the case, and the second supporting portion comprises a sunken portion adapted to assemble with the rugged structure.

According to the claimed invention, the rugged structure is disposed on a lateral wall of the block facing the lens component. The rugged structure is a sunken structure, and the lens component comprises a protruding portion adapted to insert into the sunken structure; or, the rugged structure is a protruding structure adapted to insert into a sunken structure formed on the lens component.

The optical detection device of the present application can have the case usually made of non-conductive material, such as plastic, for electrostatic protection, and the lens component can receive the optical signals through the opening structure of the case, so that the electrostatic discharge path can be the route from the opening structure, through the air gap, to the nearest electrode on the circuit board. The lens component of the optical detection device can be disposed between the circuit board and the opening structure of the case, and the electrostatic discharge path can be stretched through a gap between the lens component and the case into the accommodating chamber of the case. For obviously lengthening the length of the electrostatic discharge path, the present application provides several embodiments to increase a complicated degree and a length of the gap formed between the lens component and the case, such as reducing the width of the supporting portion of the lens component, setting the rugged structure formed as a protruding type or a sunken type inside the case for engaging with the lens component, and disposing the protruding portion or the sunken portion on the supporting portion of the lens component used to engage with the corresponding rugged structure, so as to lengthen the electrostatic discharge path without changing the outward appearance of the optical detection device; features of the opening structure and the rugged structure of the case, and the protruding portion or the sunken portion of the lens component can be clearly defined to ensure that the shortest discharge path of the optical detection device can follow the predefined electrostatic discharge path to arrive the nearest electrode with electrostatic protection design.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
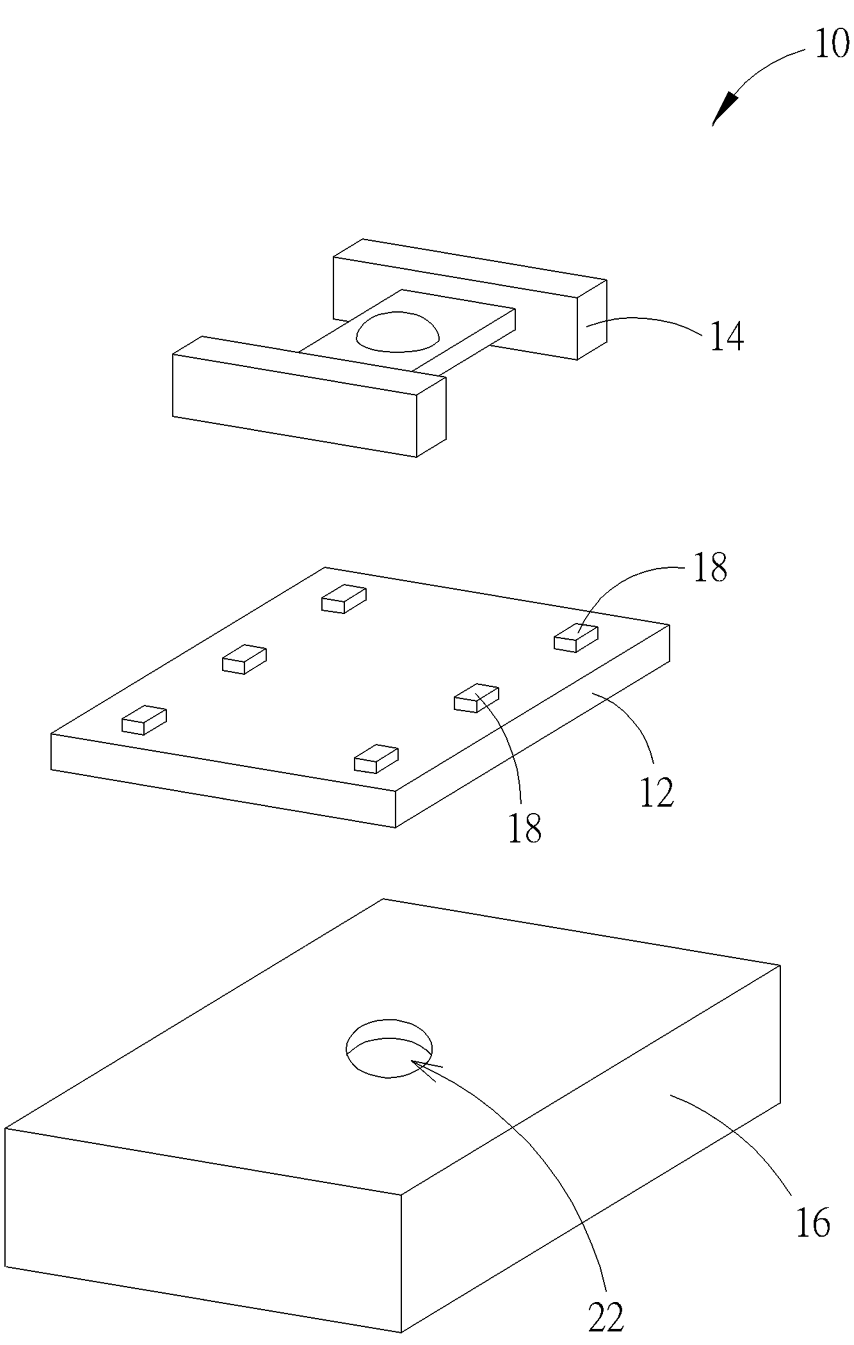
FIG. 1 is a diagram of an optical detection device according to an embodiment of the present application.
Figure 2:
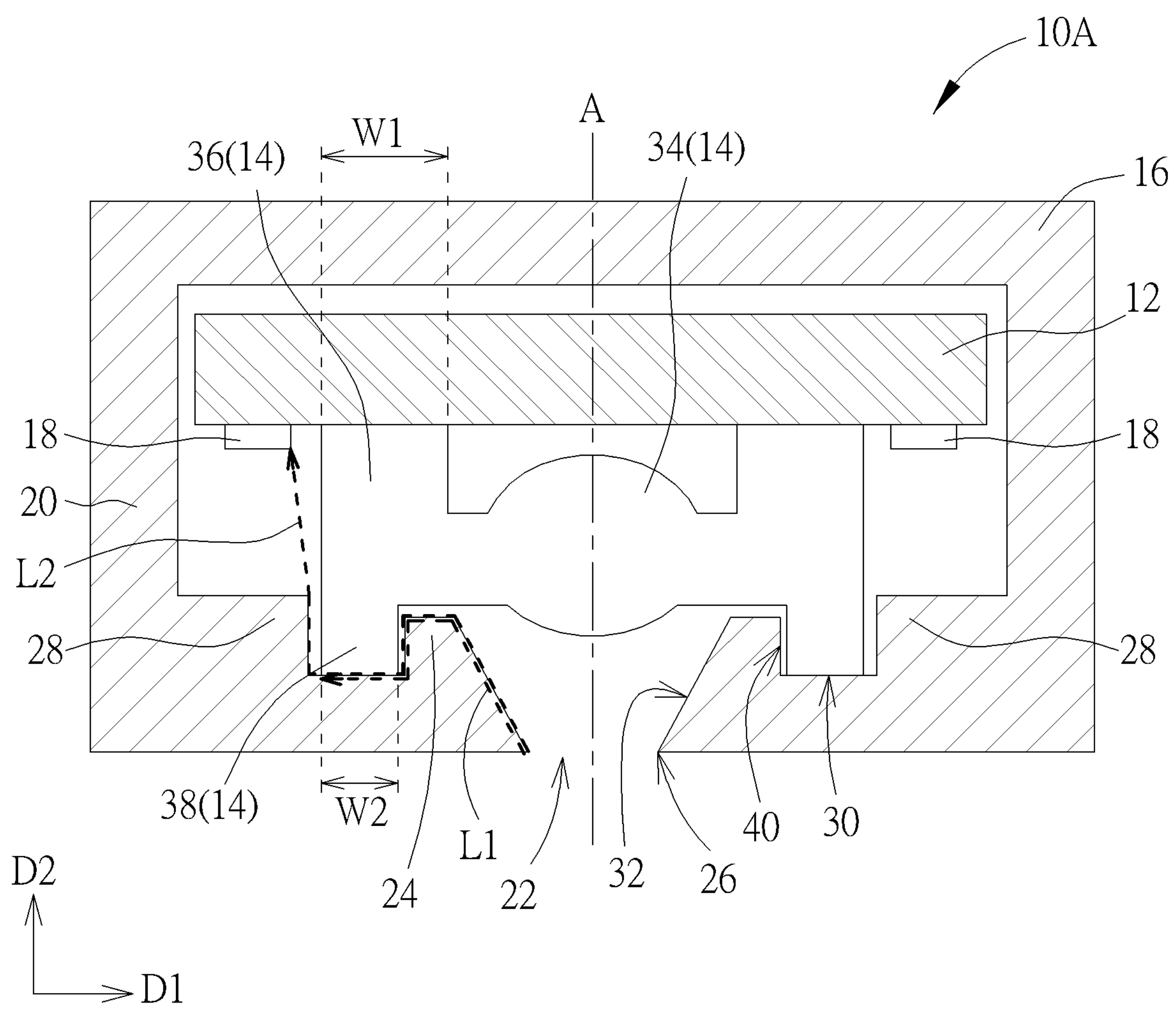
FIG. 2 is a sectional view of the optical detection device according to a first embodiment of the present application.

Please refer to FIG. 1 and FIG. 2. FIG. 1 is a diagram of an optical detection device 10 according to an embodiment of the present application. FIG. 2 is a sectional view of the optical detection device 10A according to a first embodiment of the present application. The optical detection device 10 may have several internal structural designs; as an example shown in FIG. 2, the optical detection device 10A can include a circuit board 12, a lens component 14 and a case 16. The circuit board 12 can have a plurality of electrodes 18 used to connect with other electronic components of the optical detection device 10A for providing electronic signals. Distribution and a number of the electrode 18 are not limited to the embodiment shown in FIG. 1, and depend on a design demand.

The lens component 14 can be disposed on the circuit board 12. The lens component 14 and the circuit board 12 can be both disposed inside the case 16. The case 16 can include an accommodating chamber 20, an opening structure 22 and a rugged structure 24 integrated with each other. The accommodating chamber 20 can accommodate the circuit board 12 and the lens component 14. The opening structure 22 can be communicated with the accommodating chamber 20. The lens component 14 can receive optical signals from outside of the case 16 through the opening structure 22. The rugged structure 24 can be disposed around the opening structure 22, and used to engage with the lens component 14, so as to utilize surface undulation of the rugged structure 24 to lengthen an electrostatic discharge path which is set from the opening structure 22 to a nearest electrode 18 of the plurality of electrodes 18.

Generally, the opening structure 22 and the rugged structure 24 of the case 16 can preferably be symmetrical design, which means a plurality of distances between each section of an outer edge 26 of the opening structure 22 and each corresponding section of the rugged structure 24 can have the same value, or a difference between any two of the plurality of distances is smaller than a first predefined threshold. The outer edge 26 can be uniformly divided to define the foresaid each section of the outer edge 26; the rugged structure 24 can be further divided in the same manner to define the corresponding sections. An actual value of the first predefined threshold can be designed in accordance with the whole size of the case 16, and a detailed description is omitted herein for simplicity. Therefore, all orientation between the opening structure 22 and the rugged structure 24 can provide a discharge path L1 having the same or similar length; a discharge path L2 can be defined as a route from the rugged structure 24 to the nearest electrode 18 of the plurality of electrodes 18 through an air gap. The electrostatic discharge path can be a combination of the discharge path L1 and the discharge path L2 from the opening structure 22 to the nearest electrode 18. The present application is intended to lengthen the electrostatic discharge path by adjustment of the discharge path L1.

It should be mentioned that a plurality of intervals between a central axis A of the opening structure 22 and each section of the outer edge 26 can have the same value, or a difference between any two of the plurality of intervals is smaller than a second predefined threshold; that is to say, an aperture on the opening structure 22 can be preferably designed as a round type, which can be varied on the design demand. An actual value of the second predefined threshold can depend on an aperture size of the opening structure 22, and the detailed description is omitted herein for simplicity.

As shown in FIG. 2, the case 16 can further include a block 28 and an abutting surface 30. The block 28 can be disposed on position adjacent to a side of the lens component 14 opposite to the opening structure 22. The lens component 14 can be clamped by the rugged structure 24 and the block 28 for constraining a movement of the lens component 14 in a horizontal direction D1, so as to fix the lens component 14 inside the case 16. The lens component 14 can be disposed on the circuit board 12 and further be pressed by the case 16, and a movement of the lens component 14 in a vertical direction D2 can be constrained by assembly of the circuit board 12 and the case 16. The abutting surface 30 can be located adjacent to a lateral wall 32 of the opening structure 22 and adapted to abut against the lens component 14. The rugged structure 24 can be protruded from the abutting surface 30 and located between the lens component 14 and the opening structure 22, and used to fix the lens component 14 and lengthen the electrostatic discharge path.

The lens component 14 can include a lens body 34, a first supporting portion 36 and a second supporting portion 38. The first supporting portion 36 and the second supporting portion 38 can be respectively stretched from two opposite sides of the lens body 34. The first supporting portion 36 can abut against and be connected with the circuit board 12. The second supporting portion 38 can abut against the case 16, and be fixed by the rugged structure 24 and the block 28 for constraining its movement. As shown in FIG. 2, the rugged structure 24 can abut against an inner lateral surface 40 of the second supporting portion 38 adjacent to the lens body 34; because the rugged structure 24 can be protruded from the abutting surface 30, the second supporting portion 38 can be reduced inwardly to provide a space for accommodating the rugged structure 24 with a large size, which means a structural width W2 of the second supporting portion 38 can be smaller than a structural width W1 of the first supporting portion 36.

Figure 3:
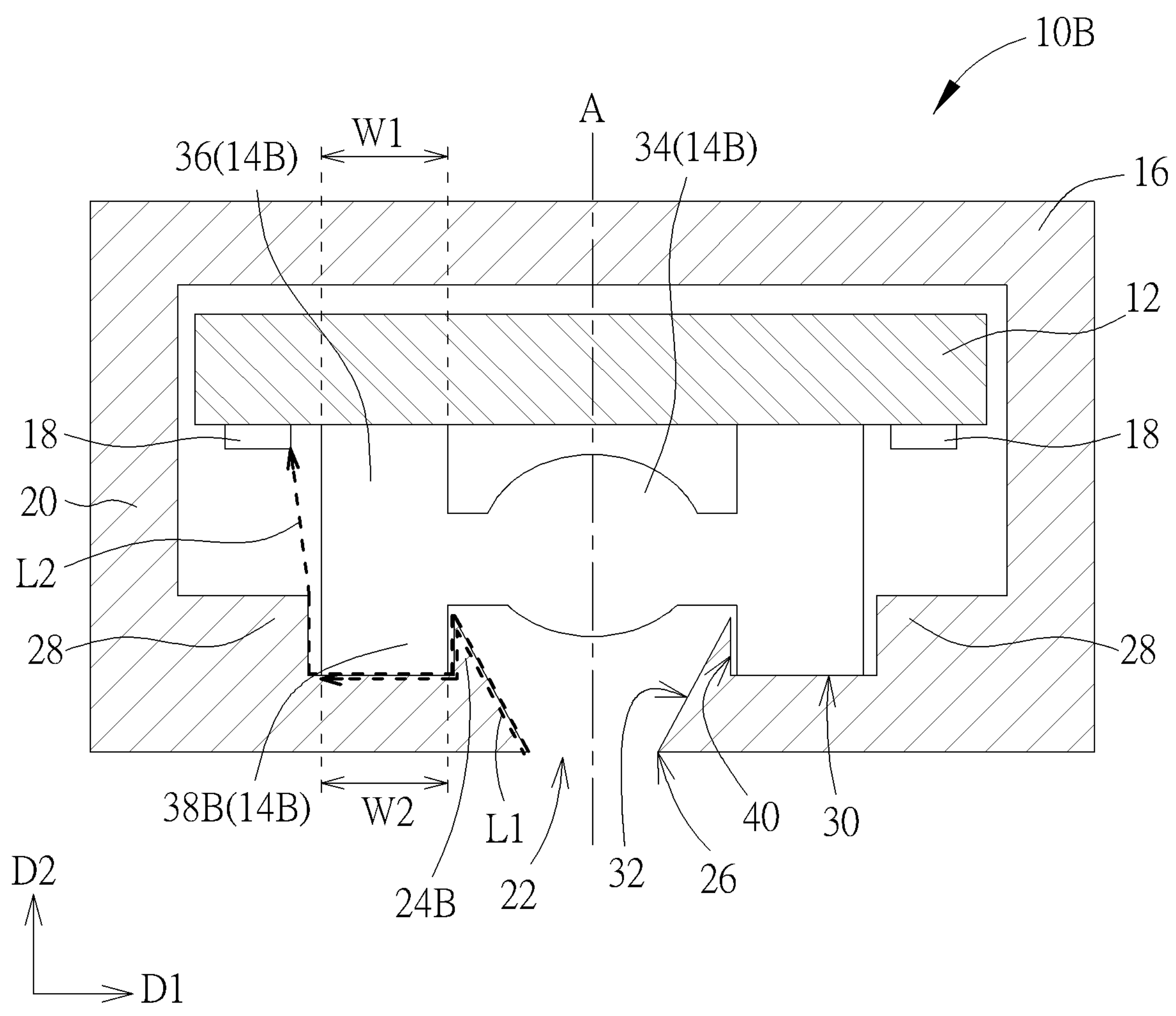
FIG. 3 is a sectional view of the optical detection device according to a second embodiment of the present application.

Please refer to FIG. 3. FIG. 3 is a sectional view of the optical detection device 10B according to a second embodiment of the present application. The optical detection devices 10A and 10B may have the same outward appearance, as shown in FIG. 1. In the second embodiment, elements having the same numerals as ones of the first embodiment have the same structures and functions, and the detailed description is omitted herein for simplicity. The lens component 14B of the optical detection device 10B can have two supporting portions with the same structural width. The structural width W2 of the second supporting portion 38B can be the same as or similar to the structural width W1 of the first supporting portion 36, and the case 16 can have the rugged structure 24B with a small size disposed on the abutting surface 30, and the rugged structure 24B can be also used to fix the lens component 14 and lengthen the electrostatic discharge path.

Figure 4:
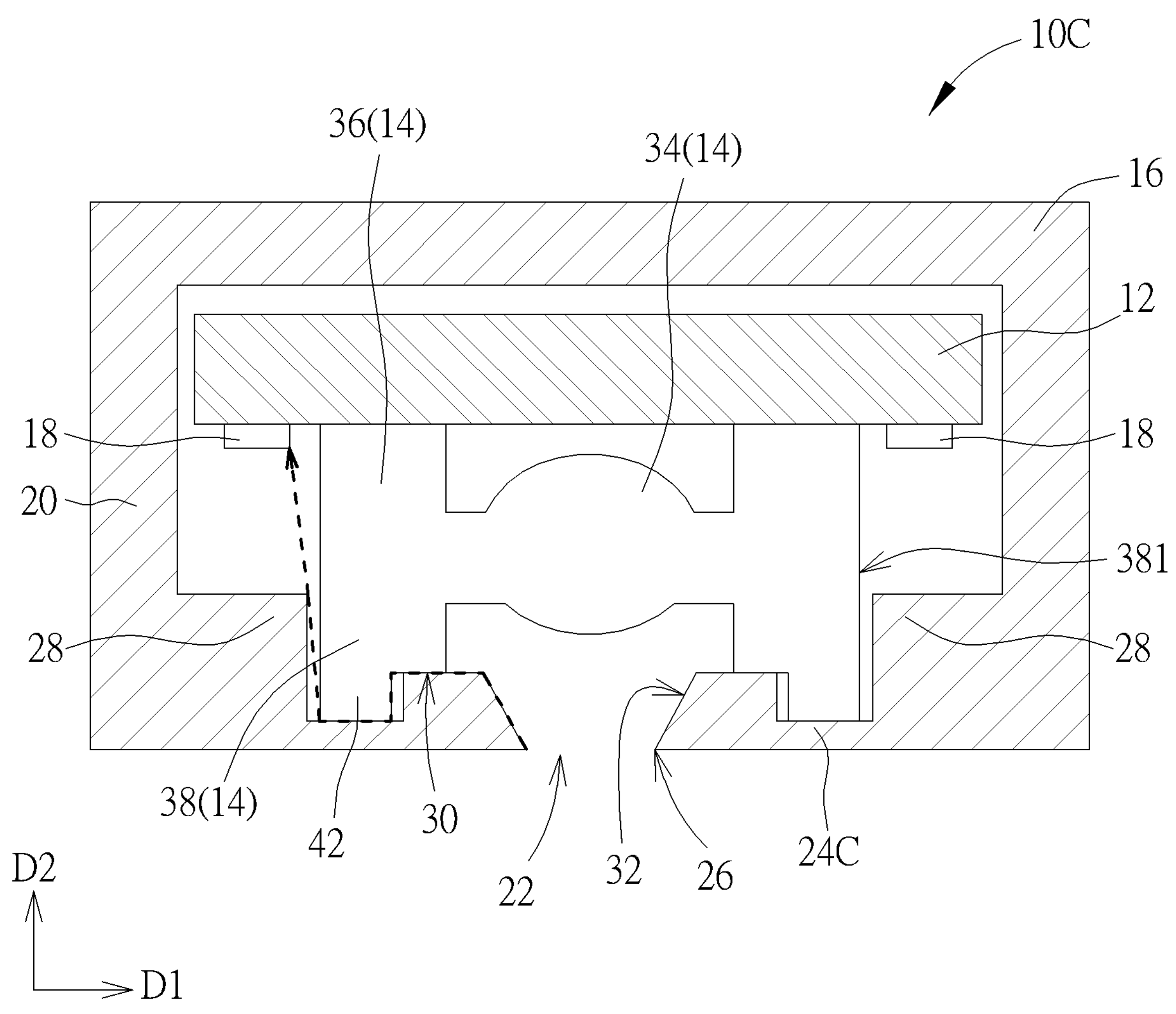
FIG. 4 is a sectional view of the optical detection device according to a third embodiment of the present application.
Figure 5:
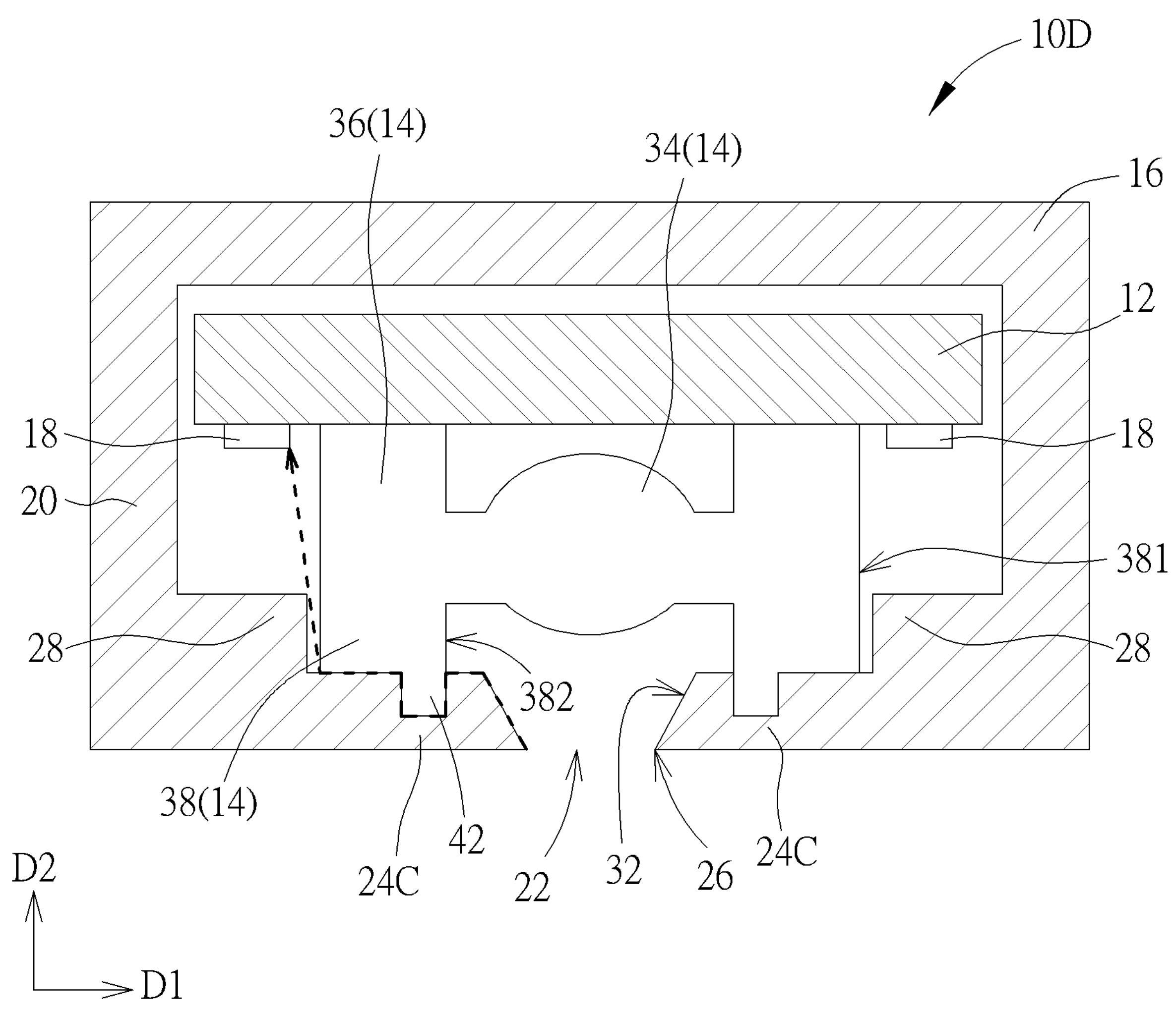
FIG. 5 is a sectional view of the optical detection device according to a fourth embodiment of the present application.
Figure 6:
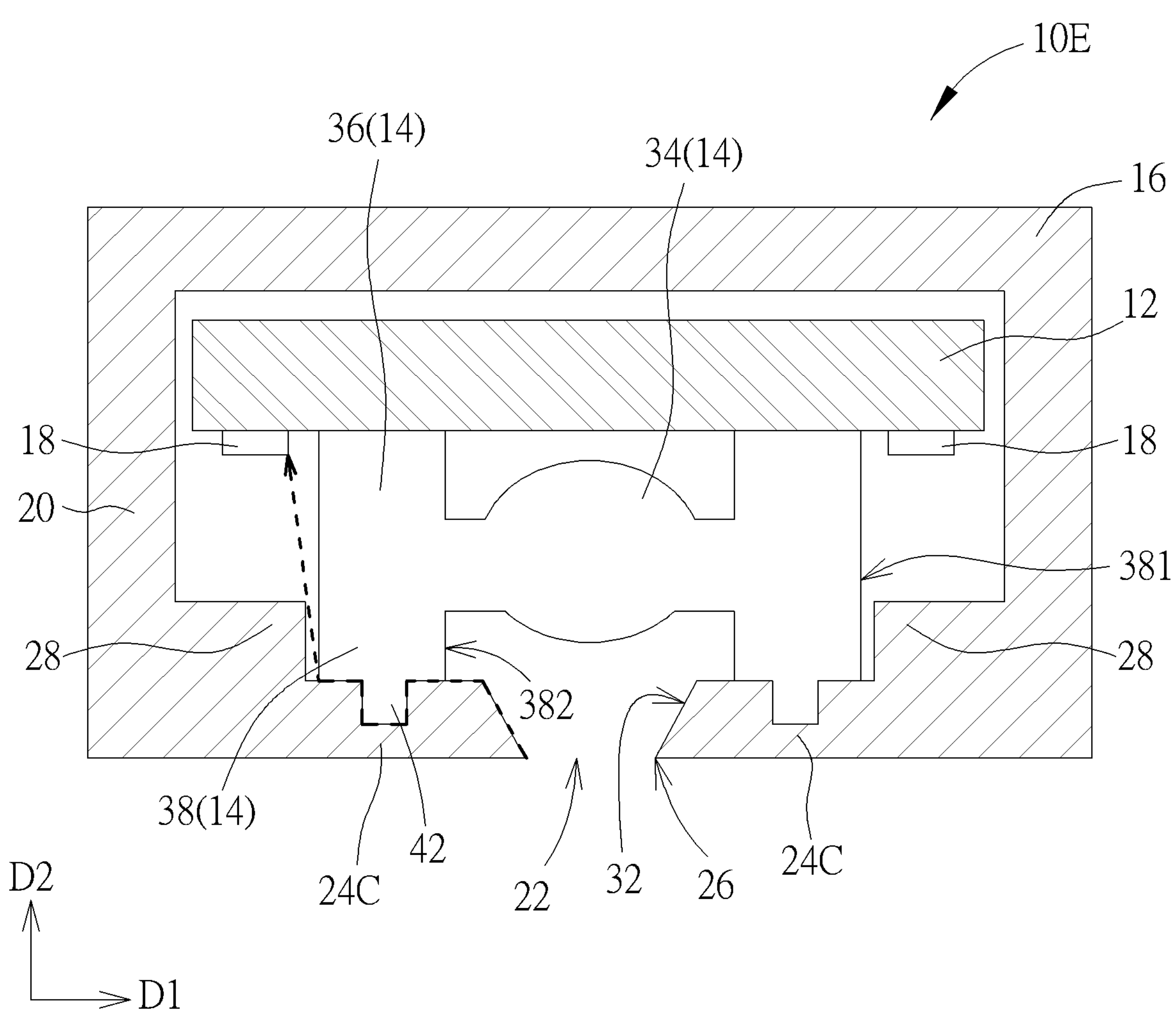
FIG. 6 is a sectional view of the optical detection device according to a fifth embodiment of the present application.

Please refer to FIG. 4 to FIG. 6. FIG. 4 is a sectional view of the optical detection device 10C according to a third embodiment of the present application. FIG. 5 is a sectional view of the optical detection device 10D according to a fourth embodiment of the present application. FIG. 6 is a sectional view of the optical detection device 10E according to a fifth embodiment of the present application. In those embodiments, elements having the same numerals as ones of the above-mentioned embodiments have the same structures and functions, and the detailed description is omitted herein for simplicity. As shown in FIG. 4, the case 16 can have the abutting surface 30 connected with the lateral wall 32 of the opening structure 22 and adapted to abut against the lens component 14; the rugged structure 24C of the third embodiment can be concavely formed on position of the abutting surface 30 facing towards the lens component 14, instead of being protruded from the abutting surface 30. The structural width W2 of the second supporting portion 38 can be the same as or similar to the structural width W1 of the first supporting portion 36; however, the lens component 14 can further have a protruding portion 42 disposed on an end of the second supporting portion 38 opposite to the first supporting portion 36, and used to insert into the rugged structure 24C.

An overall size of the protruding portion 42 can be the same as or similar to an overall size of the rugged structure 24C, so that the protruding portion 42 can be inserted into the rugged structure 24C in a tight fit manner, and the second supporting portion 38 and the related protruding portion 42 can be tightly constrained by the circuit board 12, the block 28, the abutting surface 30 and the rugged structure 24C in the horizontal direction D1 and in the vertical direction D2.

The rugged structure 24C of the third embodiment can be used to fix the lens component 14 and lengthen the electrostatic discharge path. As shown in FIG. 4, the protruding portion 42 can be disposed on position adjacent to an outer lateral surface 381 of the second supporting portion 38 opposite to the lens body 34, and actual position of the protruding portion 42 can depend on the design demand.

As shown in FIG. 5, the protruding portion 42 can be optionally disposed on position adjacent to an inner lateral surface 382 of the second supporting portion 38 near to the lens body 34. In the fourth embodiment, the rugged structure 24C can be stilled concavely formed on the position of the abutting surface 30 facing the lens component 14, but its location can be further close to the lateral wall 32 of the opening structure 22. As shown in FIG. 6, the protruding portion 42 can be further optionally disposed on a middle part of the second supporting portion 38 between the outer lateral surface 381 and the inner lateral surface 382; in the fifth embodiment, the rugged structure 24C can be concavely formed on the position of the abutting surface 30 facing toward the lens component 14, and located on the middle of the abutting surface 30. The rugged structure 24C in the fourth embodiment and the fifth embodiment can be used to fix the lens component 14 and lengthen the electrostatic discharge path.

Figure 7:
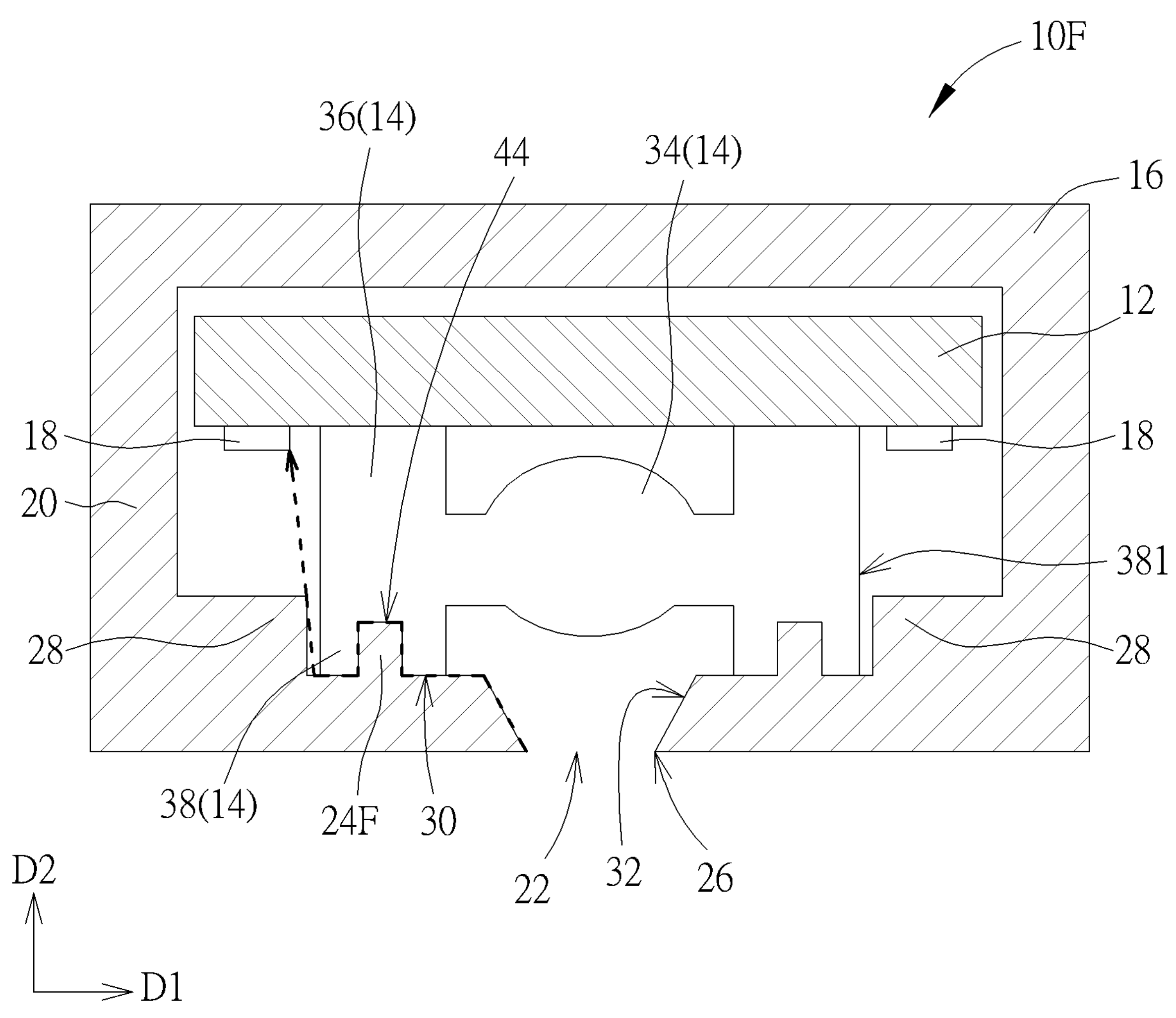
FIG. 7 is a sectional view of the optical detection device according to a sixth embodiment of the present application.

Please refer to FIG. 7. FIG. 7 is a sectional view of the optical detection device 10F according to a sixth embodiment of the present application. In the sixth embodiment, elements having the same numerals as ones of the above-mentioned embodiments have the same structures and functions, and the detailed description is omitted herein for simplicity. The case 16 of the sixth embodiment can have the abutting surface 30 connected with the lateral wall 32 of the opening structure 22 and used to abut against the lens component 14; the rugged structure 24F can be protruded from position of the abutting surface 30 aligning with the lens component 14. Accordingly, the second supporting portion 38 of the lens component 14 can have a sunken portion 44 formed on the end of the second supporting portion 38 opposite to the first supporting portion 36. The rugged structure 24F of the case 16 can be inserted into the sunken portion 44 of the lens component 14, so as to fix the lens component 14 and lengthen the electrostatic discharge path.

Figure 8:
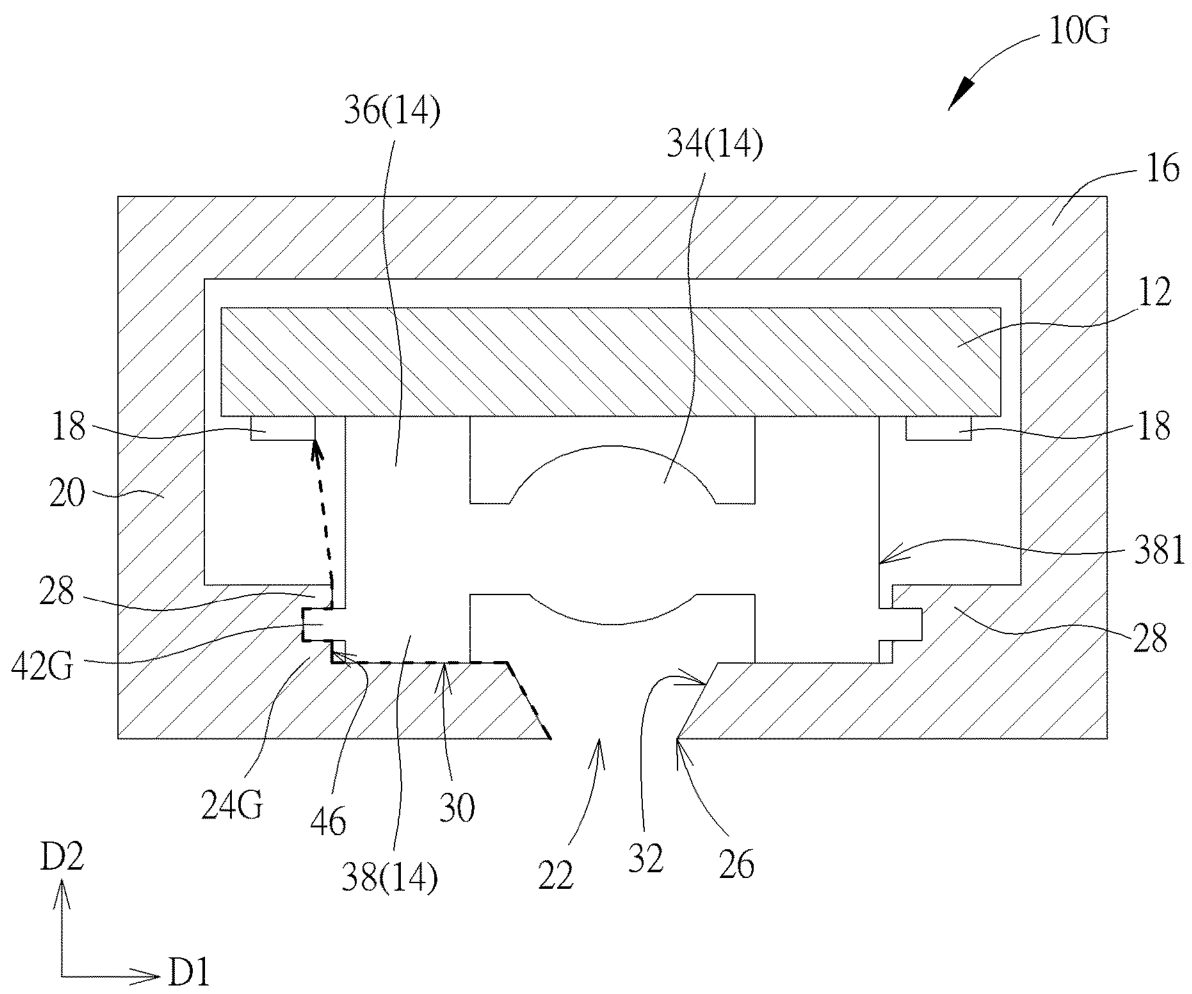
FIG. 8 is a sectional view of the optical detection device according to a seventh embodiment of the present application.
Figure 9:
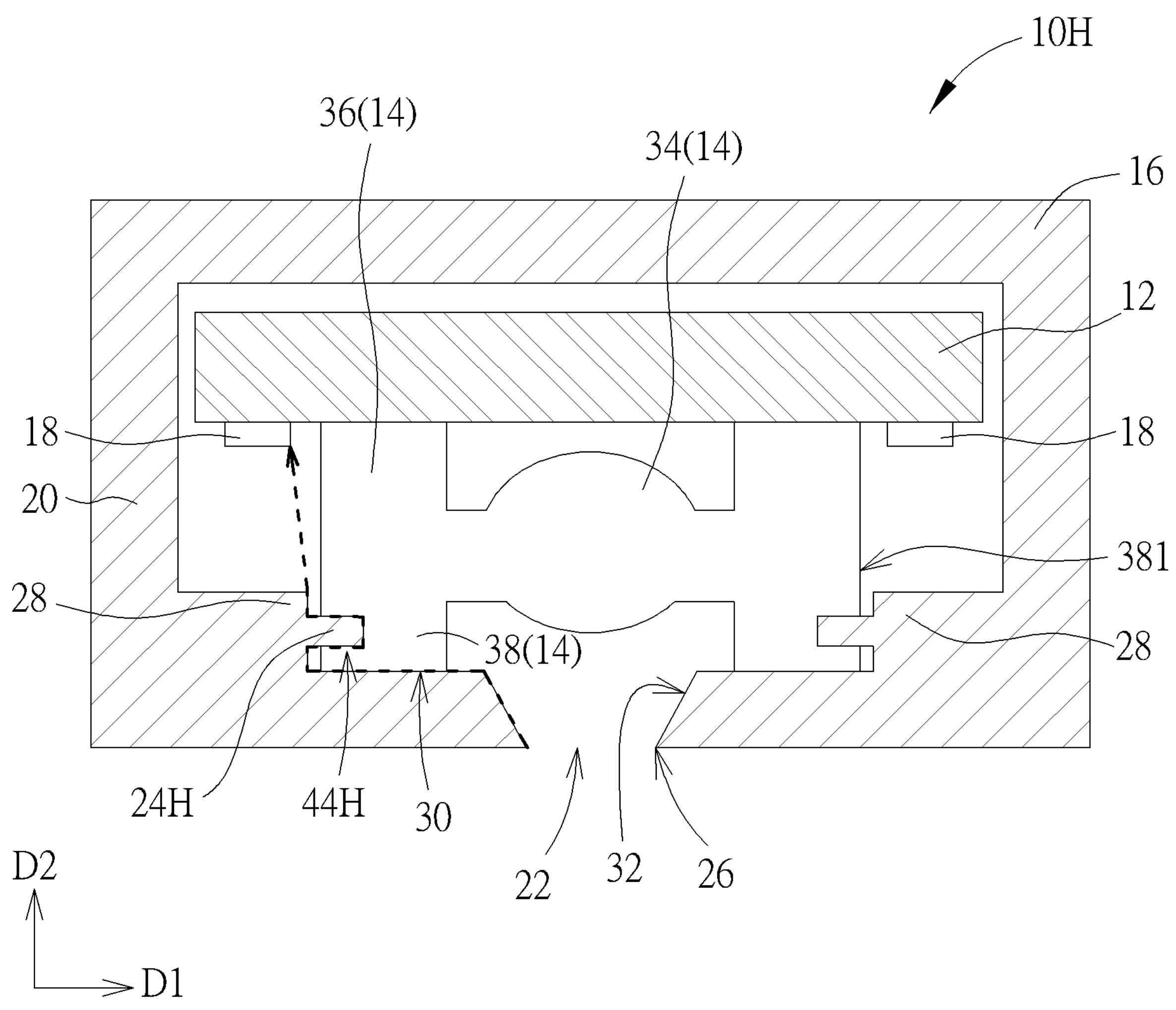
FIG. 9 is a sectional view of the optical detection device according to an eighth embodiment of the present application.
Figure 10:
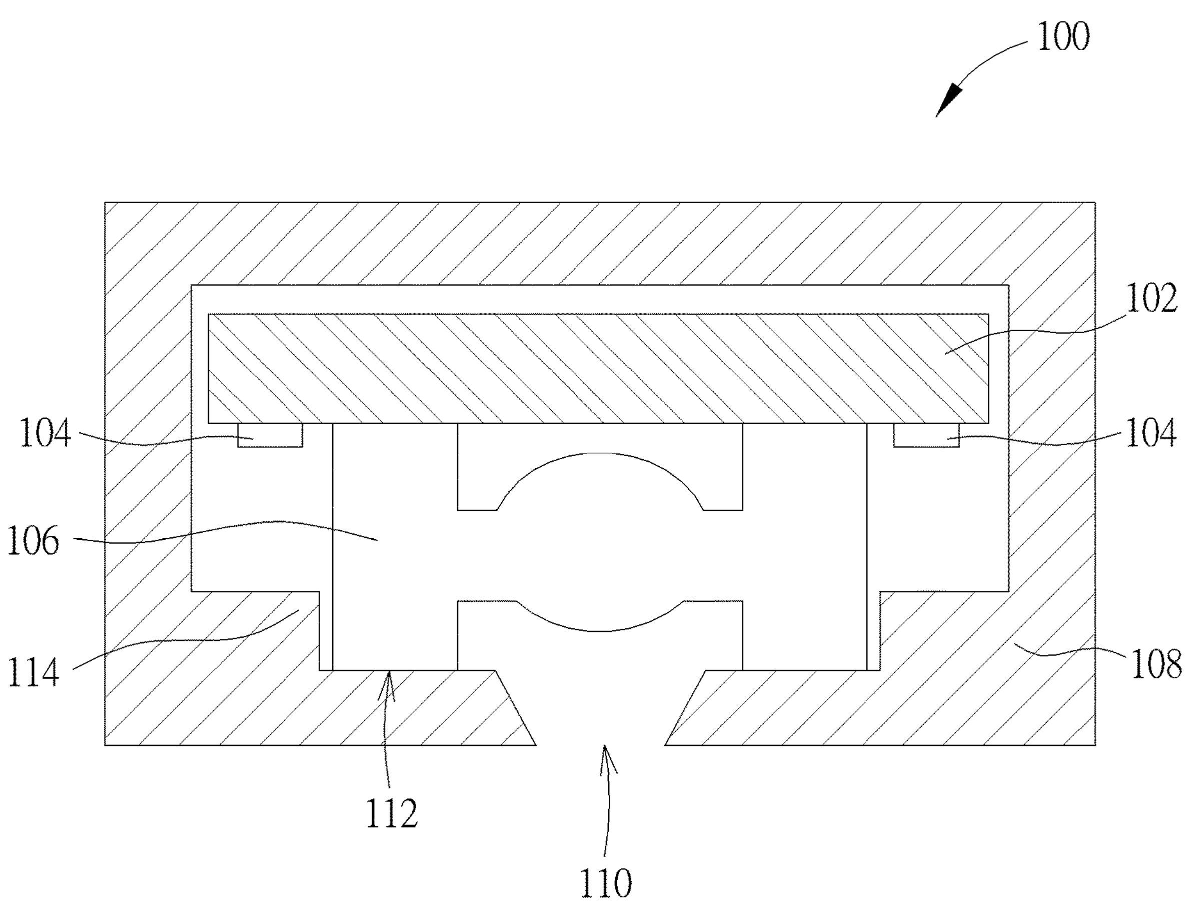
FIG. 10 is a sectional view of an optical detection device in the prior art.

Please refer to FIG. 8 and FIG. 9. FIG. 8 is a sectional view of the optical detection device 10G according to a seventh embodiment of the present application. FIG. 9 is a sectional view of the optical detection device 10H according to an eighth embodiment of the present application. In the seventh embodiment and the eighth embodiment, elements having the same numerals as ones of the above-mentioned embodiments have the same structures and functions, and the detailed description is omitted herein for simplicity. As shown in FIG. 8, the case 16 of the seventh embodiment can form the rugged structure 24G on a lateral wall 46 of the block 28 facing towards the lens component 14; in addition, the rugged structure 24G can be a sunken structure, and the protruding portion 42G of the lens component 14 can be disposed on the outer lateral surface 381 of the second supporting portion 38 opposite to the lens body 34, and used to insert into the rugged structure 24G (which means the sunken structure).

As shown in FIG. 9, the rugged structure 24H of the eighth embodiment can be designed as a protruding structure, and the sunken portion 44H of the lens component 14 can be formed on the outer lateral surface 381 of the second supporting portion 38 opposite to the lens body 34, and the rugged structure 24H (which means the protruding structure) can be inserted into the sunken portion 44H. The rugged structure 24G of the seventh embodiment and the rugged structure 24H of the eighth embodiment can be used to fix the lens component 14 and lengthen the electrostatic discharge path.

In the present application, the sectional views of the foresaid embodiments can be preferably designed as symmetrical structures, which means that the electrostatic discharge path can have the same path length in any direction and be greater than an electrostatic discharge path of this structure in the prior art, so as to ensure static electricity can be smoothly discharged no matter from which direction the static electricity enters the optical detection device. In other possible embodiments, even if the sectional view of the specific structure belongs to an asymmetrical type, the discharge path from the opening structure to the electrode still needs to have the same path length in all directions and be greater than the electrostatic discharge path of this structure in the prior art, so that the can be smoothly discharged through the preset electrostatic discharge path, thereby enhancing effectiveness of electrostatic protection of the optical detection device.

In conclusion, the optical detection device of the present application can have the case usually made of non-conductive material, such as plastic, for electrostatic protection, and the lens component can receive the optical signals through the opening structure of the case, so that the electrostatic discharge path can be the route from the opening structure, through the air gap, to the nearest electrode on the circuit board. The lens component of the optical detection device can be disposed between the circuit board and the opening structure of the case, and the electrostatic discharge path can be stretched through a gap between the lens component and the case into the accommodating chamber of the case. For obviously lengthening the length of the electrostatic discharge path, the present application provides several embodiments to increase a complicated degree and a length of the gap formed between the lens component and the case, such as reducing the width of the supporting portion of the lens component, setting the rugged structure formed as a protruding type or a sunken type inside the case for engaging with the lens component, and disposing the protruding portion or the sunken portion on the supporting portion of the lens component used to engage with the corresponding rugged structure, so as to lengthen the electrostatic discharge path without changing the outward appearance of the optical detection device; features of the opening structure and the rugged structure of the case, and the protruding portion or the sunken portion of the lens component can be clearly defined to ensure that the shortest discharge path of the optical detection device can follow the predefined electrostatic discharge path to arrive the nearest electrode with electrostatic protection design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical detection device with enhanced electrostatic discharge immunity, comprising:

a circuit board having a plurality of electrodes;

a lens component disposed on the circuit board; and a case comprising an accommodating chamber and an opening structure, the accommodating chamber being adapted to accommodate the circuit board and the lens component, the opening structure being communicated with the accommodating chamber and aligning with the lens component, the case further comprising a rugged structure disposed around the opening structure and adapted to present an all-around symmetry for remaining distances of all orientations between the opening structure and the rugged structure being identical and synchronously increased, and further to engage with the lens component for extending an electrostatic discharge path from the opening structure to a nearest electrode of the plurality of electrodes.

2. The optical detection device of claim 1, wherein a plurality of distances between each section of an outer edge of the opening structure and each corresponding section of the rugged structure has the same value, or a difference between any two of the plurality of distances is smaller than a predefined threshold.

3. The optical detection device of claim 1, wherein a plurality of intervals between a central axis of the opening structure and each section of an outer edge of the opening structure has the same value, or a difference between any two of the plurality of intervals is smaller than a predefined threshold.

4. The optical detection device of claim 1, wherein the case further comprises a block disposed on position adjacent to a side of the lens component opposite to the opening structure, the rugged structure and the block are adapted to fix the lens component.

5. The optical detection device of claim 1, wherein the case further comprises an abutting surface connected with a lateral wall of the opening structure and adapted to abut against the lens component, the rugged structure is protruded from the abutting surface and located between the lens component and the opening structure.

6. The optical detection device of claim 1, wherein the lens component comprises a lens body, a first supporting portion and a second supporting portion, the first supporting portion and the second supporting portion are respectively stretched from two opposite sides of the lens body to connect the circuit board and the case, and the rugged structure contacts an inner lateral surface of the second supporting portion adjacent to the lens body.

7. The optical detection device of claim 6, wherein a structural width of the second supporting portion is the same as or smaller than a structural width of the first supporting portion.

8. The optical detection device of claim 1, wherein the case further comprises an abutting surface connected with a lateral wall of the opening structure and adapted to abut against the lens component, the rugged structure is concavely formed on position of the abutting surface facing the lens component.

9. The optical detection device of claim 1, wherein the lens component comprises a lens body, a first supporting portion and a second supporting portion, the first supporting portion and the second supporting portion are respectively stretched from two opposite sides of the lens body to connect the circuit board and the case, and the second supporting portion comprises a protruding portion inserted into the rugged structure.

10. The optical detection device of claim 9, wherein the protruding portion is disposed on an outer lateral surface of the second supporting portion opposite to the lens body, or an inner lateral surface of the second supporting portion adjacent to the lens body, or a middle part between the inner lateral surface and the outer lateral surface.

11. The optical detection device of claim 1, wherein the case further comprises an abutting surface connected with a lateral wall of the opening structure and adapted to abut against the lens component, the rugged structure is protruded from position of the abutting surface aligning with the lens component.

12. The optical detection device of claim 1, wherein the lens component comprises a lens body, a first supporting portion and a second supporting portion, the first supporting portion and the second supporting portion are respectively stretched from two opposite sides of the lens body to connect the circuit board and the case, and the second supporting portion comprises a sunken portion adapted to assemble with the rugged structure.

13. The optical detection device of claim 4, wherein the rugged structure is disposed on a lateral wall of the block facing the lens component.

14. The optical detection device of claim 13, wherein the rugged structure is a sunken structure, and the lens component comprises a protruding portion adapted to insert into the sunken structure.

15. The optical detection device of claim 13, wherein the rugged structure is a protruding structure adapted to insert into a sunken structure formed on the lens component.

* * * * *